(12) United States Patent
Tometsuka

(10) Patent No.: US 6,780,251 B2
(45) Date of Patent: Aug. 24, 2004

(54) SUBSTRATE PROCESSING APPARATUS AND METHOD FOR FABRICATING SEMICONDUCTOR DEVICE

(75) Inventor: Kouji Tometsuka, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 73 days.

(21) Appl. No.: 10/196,958

(22) Filed: Jul. 18, 2002

(65) Prior Publication Data

US 2003/0019585 A1 Jan. 30, 2003

(30) Foreign Application Priority Data

Jul. 19, 2001 (JP) .......................................... 2001-219441

(51) Int. Cl.⁷ .......................... H01L 21/00; C23C 16/00
(52) U.S. Cl. ..................... 118/725; 118/728; 219/444.1; 219/544; 392/416; 392/418; 206/832; 156/345.51; 156/345.52
(58) Field of Search ................................. 118/725, 728; 156/345.51, 345.52; 219/444.1, 544; 392/416, 418; 206/832

(56) References Cited

U.S. PATENT DOCUMENTS

| 5,516,283 | A | * | 5/1996 | Schrems ....................... 432/241 |
| 5,926,615 | A | * | 7/1999 | Hwu et al. ................... 392/418 |
| 6,007,635 | A | * | 12/1999 | Mahawili ..................... 118/728 |
| 6,364,957 | B1 | * | 4/2002 | Schneider et al. .......... 118/728 |
| 6,576,064 | B2 | * | 6/2003 | Griffiths et al. ............. 118/728 |

FOREIGN PATENT DOCUMENTS

| JP | 63-177035 | 11/1988 |
| JP | 7-45691 | 2/1995 |

* cited by examiner

Primary Examiner—Gregory Mills
Assistant Examiner—Ram N Kackar
(74) Attorney, Agent, or Firm—Bacon & Thomas, PLLC

(57) ABSTRACT

A substrate processing apparatus includes a first holder made of silicon carbide or silicon and a second holder made of quartz. Each of the first and the second holder is of a ring shape and the second ring shaped holder is mounted on the first holder. The second holder is used to mount a substrate thereon while the substrate is being processed.

6 Claims, 6 Drawing Sheets

SUBSTRATE PROCESSING APPARATUS AND METHOD FOR FABRICATING SEMICONDUCTOR DEVICE

FIELD OF THE INVENTION

The present invention relates to a substrate processing apparatus and a method for fabricating a semiconductor device; and, more particularly, to a substrate processing apparatus and a method suitable for reducing thermal stress in a wafer during a heat treatment process thereof.

BACKGROUND OF THE INVENTION

Generally, a vertical hot-wall type batch heat treatment apparatus (referred to as a hot-wall type heat treatment apparatus hereinafter) is used for a heat treatment, such as an oxidization process and a diffusion process for fabricating an integrated circuit (IC).

The hot-wall type heat treatment apparatus includes a vertically arranged process tube and a heater positioned outside the process tube. The process tube has an inner tube and an outer tube that surrounds the inner tube, acting as a process chamber. After a plurality of wafers, each being horizontally arranged in a boat, are loaded into the inner tube via a furnace mouth positioned at a lower end portion of the inner tube, the heater applies heat to the process tube so that the wafers are heat-treated.

In the above-explained hot-wall type heat treatment apparatus, the boat usually includes a couple of end plates, three supporting members, and a plurality of supporting grooves. Each of the supporting members is vertically interposed between the couple of end plates, and the supporting grooves are inwardly opened at an equal interval along each of the supporting members. Three of the supporting grooves, each being included in a different supporting member but positioned on a same plane, provide a stage such that one of the wafers is located thereon. Consequently, the plurality of wafers are vertically arranged parallel to each other along the supporting members in the boat, wherein the centers of the wafers are aligned along a vertical straight line.

Since, however, each of the wafers is supported by three supporting grooves only, a rapid thermal stress may cause crystallographic defects (e.g., slip) in the wafer or, in certain cases, may entail a bending thereof. It is because the entire weight of the wafer is sustained only at a few points, so that concentration of tensile and load stress occurs at each contact portion between the wafer and the supporting grooves.

Japanese Patent Laid-Open Publication No. 1995-45691 discloses a wafer holder (referred to as a wafer supporting unit hereinafter) to avoid the above-mentioned problem, wherein the wafer supporting unit is made of a silicon carbide (SiC) in the shape of a circular ring on which a circumferential portion of the wafer is mounted. Since the entire weight of the wafer is sustained not by a few points but by an entire inner circumference of the wafer supporting unit, the wafer can be effectively prevented from slip formation, damage, or bending. In addition, the wafer supporting unit has an opening for a wafer suction plate (tweezers) to pass therethrough. Via the opening, the tweezers can load the wafer on the wafer supporting unit or unload the wafer therefrom while the wafer supporting unit remains supported by the supporting grooves in the boat.

Japanese Utility Patent Laid-Open Publication No. 1988-177035 discloses a wafer supporting unit for obtaining a uniform thickness of a chemical vapor deposition (CVD) film to be formed on the wafer. Such a wafer supporting unit includes a disk-shaped holder made of quartz ($SiO_2$) and a horseshoe-shaped supporting member having a protrusion for preventing a movement of the wafer. The supporting member is mounted on the holder and the wafer is mounted on the supporting member. Since the supporting member has no stepped portion, a process gas can uniformly flow thereon, so that the CVD film formed thereon can achieve a uniform thickness.

Problems of the above-explained prior art are now discussed.

In the first prior art, because a wafer made of silicon directly contacts the wafer supporting unit made of silicon carbide, the wafer may abnormally stick to the wafer supporting unit, so that the resultant deformation of the wafer may entail the slip formation thereof. In the second prior art, because quartz is usually softened at a high temperature of above 1200° C., the holder made of quartz may be deformed during the heat treatment process.

In another view, the wide opening of the first prior art wafer supporting unit as well as the second prior art horseshoe-shaped supporting member may result in a decreased temperature at a corresponding portion of the wafer. The partial difference in the temperature causes a poor uniformity of temperature distribution on the wafer, so that the CVD film formed thereon may have an irregular thickness.

SUMMARY OF THE INVENTION

It is, therefore, a primary object of the present invention to provide a substrate processing apparatus for reducing thermal stress of wafers during a heat treatment process.

In one aspect of the present invention, there is provided a substrate processing apparatus, which includes: a first holder made of silicon carbide or silicon; and a second holder made of quartz and mounted on the first holder, wherein the second holder is used to mount a substrate thereon while the substrate is being processed.

In another aspect of the present invention, there is provided a method for fabricating a semiconductor device using a substrate processing apparatus including a first holder made of silicon carbide or silicon and a second holder made of quartz, the method including the steps of: mounting a substrate on the second holder mounted on the first holder; and heating the substrate mounted on the second holder.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

Figure 1:
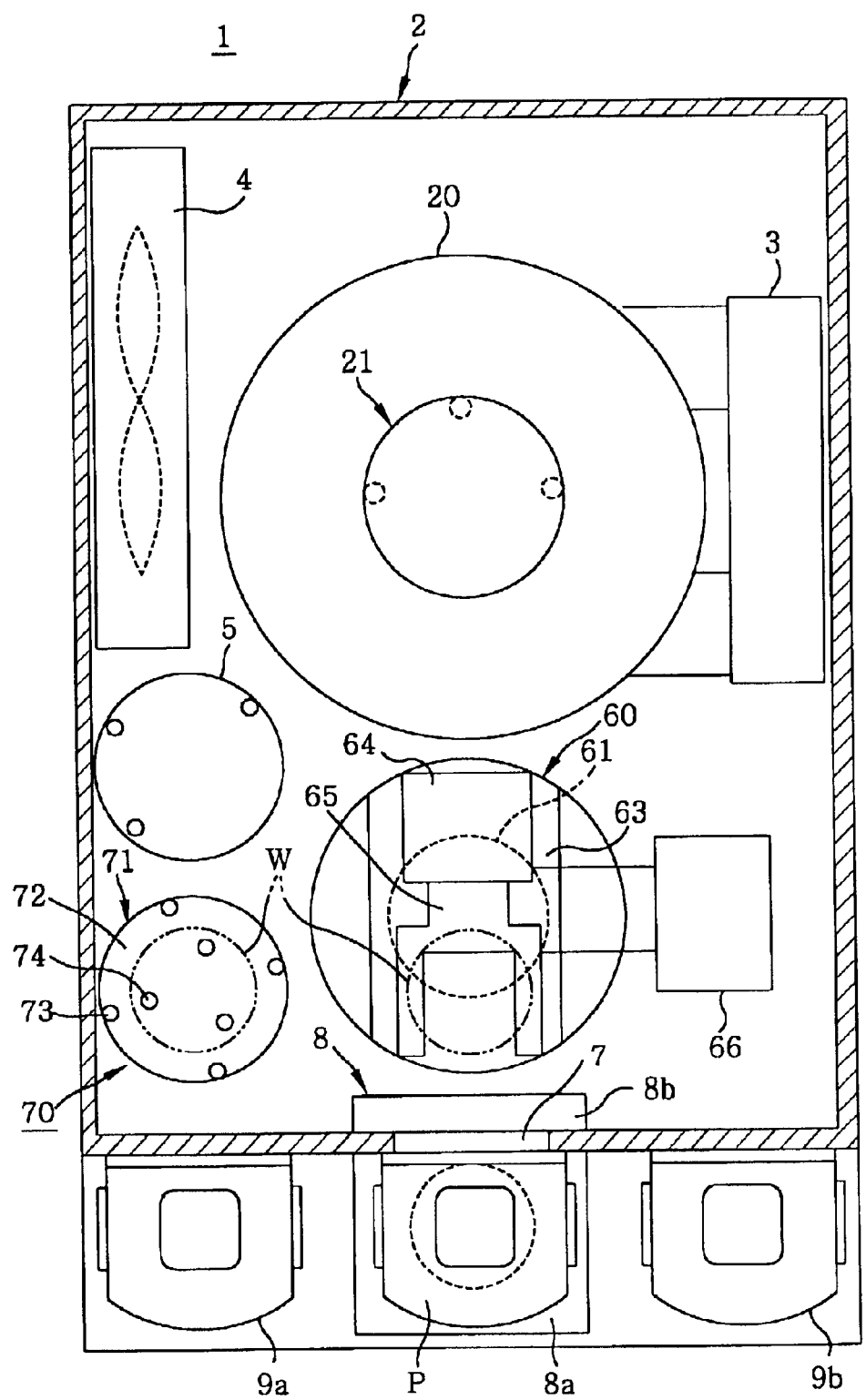
FIG. 1 presents a sectional plan view of a small batch type heat treatment apparatus in accordance with a preferred embodiment of the present invention.

Referring now to FIGS. 1 to 6, a substrate processing apparatus in accordance with a preferred embodiment of the present invention will be described in detail. Like numerals represent like parts in the drawings.

The substrate processing apparatus in accordance with the preferred embodiment is a hot-wall type heat treatment apparatus, or a vertical hot-wall type batch heat treatment apparatus, that performs a heat treatment process at a high temperature of about 1250 to 1350° C. In another view, this hot-wall type heat treatment apparatus is a batch type heat treatment apparatus suitable for processing about 510 substrates or wafers per each batch treatment. Since the number 510 is relatively small, it is called a small batch type heat treatment apparatus.

This small batch type heat treatment apparatus includes a front opening unified pod (FOUP, simply referred to as a pod hereinafter) to carry or convey the wafers. In the following descriptions, front, rear, left and right sides are defined on the basis of parts shown in FIG. 1. The front side refers to where a pod opener 8 is positioned; the rear side, an opposite side of the front side; the left side, a clean air unit 4; and finally the right side, an opposite side of the left side.

Figure 2:
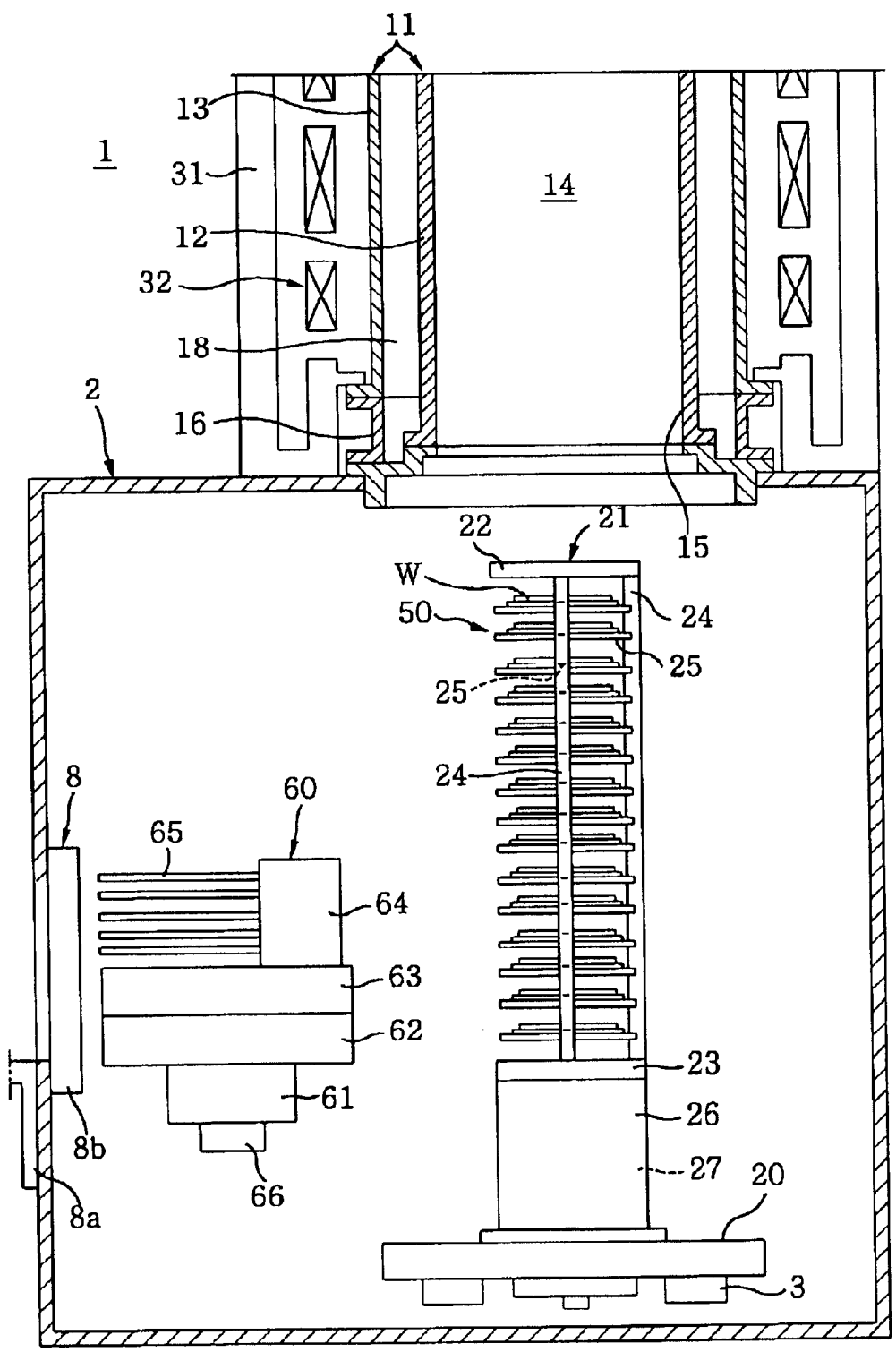
FIG. 2 is a sectional side view of FIG. 1.

As shown in FIGS. 1 and 2, the small batch type heat treatment apparatus 1 includes a box type housing 2 of a substantially rectangular shape. Disposed on the housing 2 is a process tube 11 having a centerline perpendicular to a top surface of the housing 2.

Figure 3:
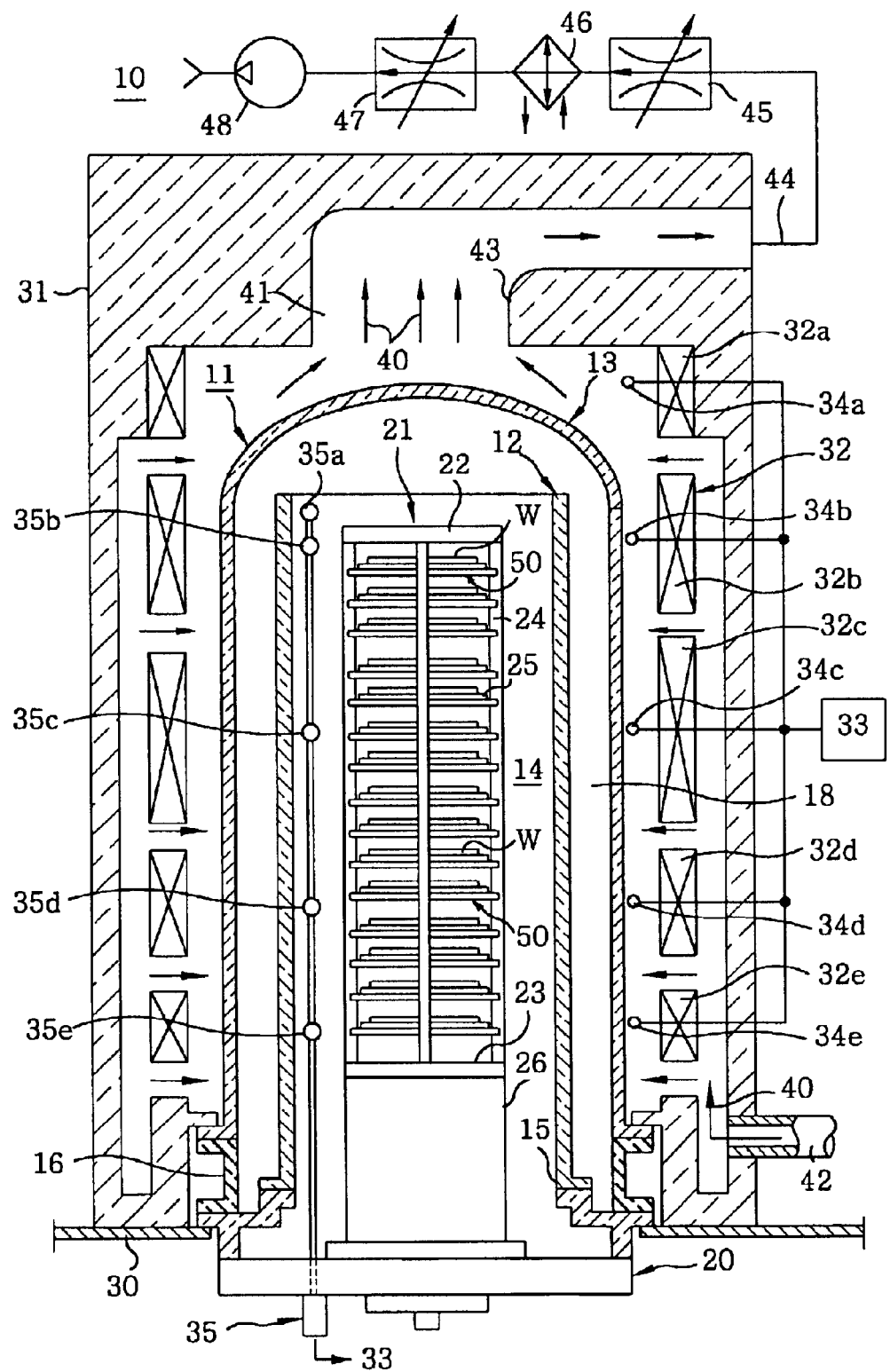
FIG. 3 represents a sectional front view of a process tube included in the small batch type heat treatment apparatus in accordance with the preferred embodiment.

In FIG. 3, the process tube 11 has an inner tube 12 and an outer tube 13, each being of a cylindrical shape. The inner tube 12 is integrally molded with quartz or silicon carbide (SiC); the outer tube 13, with quartz.

Upper and lower end portions of the inner tube 12 are opened and an inner space thereof acts as a process chamber 14 into which a boat containing a plurality of serially arranged wafers is conveyed. Since the lower open end of the inner tube 12 serves as a furnace mouth through which the boat is conveyed into or out of the process chamber 14, an inner diameter of the inner tube 12 is set to be larger than a possible maximum outer diameter of the wafer, usually about 300 mm.

The outer tube 13 has a larger inner diameter than an outer diameter of the inner tube 12 and concentrically surrounds the inner tube 12. Upper and lower end portions of the outer tube 13 are closed and opened, respectively. The lower end portions of the inner tube 12 and the outer tube 13 are hermetically sealed by a manifold 16 of a multi-staged cylindrical shape. The manifold 16 is removable from each of the inner tube 12 and the outer tube 13 such that the inner tube 12 and the outer tube 13 can be replaced with new tubes. The manifold 16 is supported by a frame 30 of the small batch type heat treatment apparatus 1 such that the process tube 11 can be vertically mounted thereon.

Figure 4:
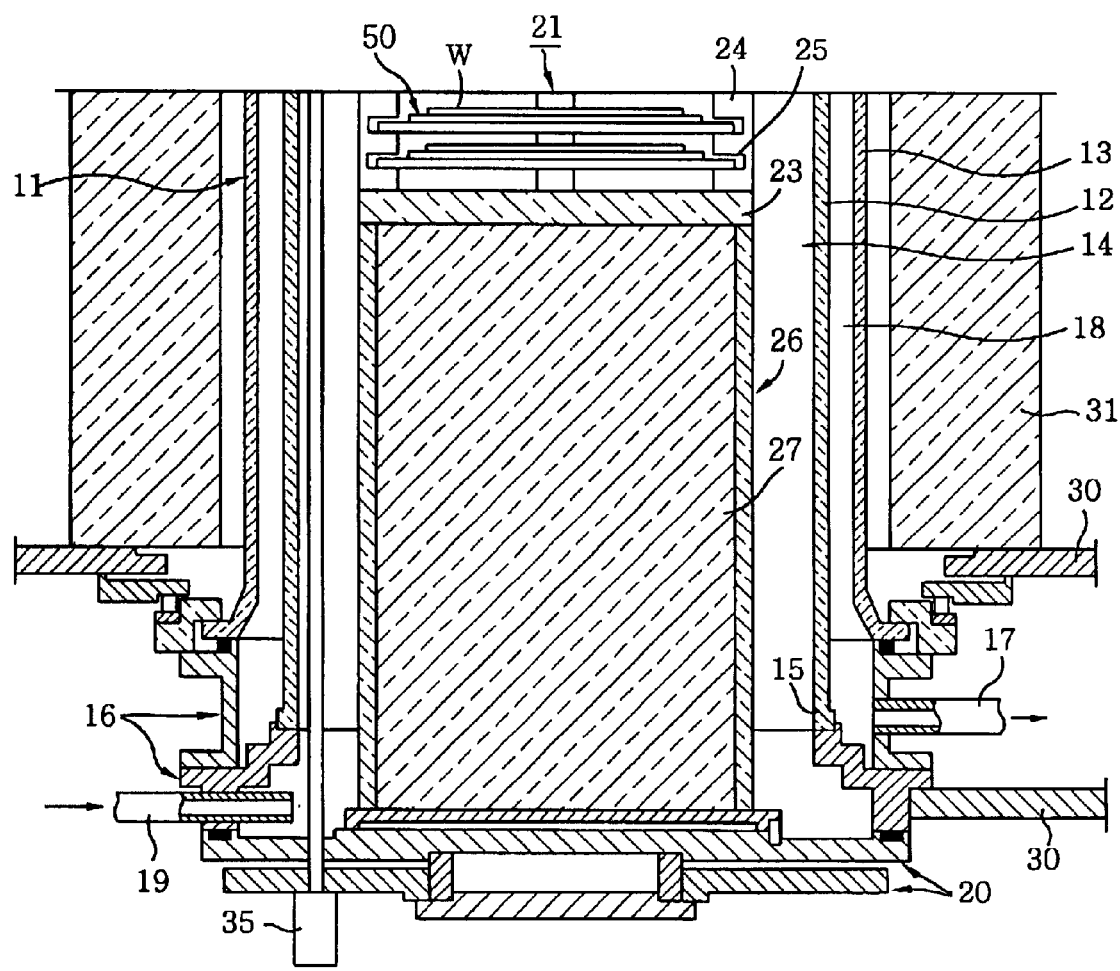
FIG. 4 depicts an extended view of FIG. 3.

In FIG. 4, the manifold 16 is connected with an exhaust pipe 17 at an upper side portion thereof. The exhaust pipe 17 is connected with an exhaust unit (not shown) and communicates with a clearance interposed between the inner tube 12 and the outer tube 13 such that the process tube 11 can be exhausted through the exhaust pipe 17. The clearance therebetween is of a cylindrical shape also and serves as an exhaust line 18 for exhausting the process tube 11. Herein, the exhaust pipe 17 is connected with the manifold 16 at near a bottom side portion of the exhaust line 18.

The furnace mouth 15 of the inner tube 12 communicates with a gas supply pipe 19 at a lower side portion of the manifold 16. The gas supply pipe 19 is connected with a material gas supply apparatus (not shown) and a carrier gas supply apparatus (not shown) and functions to introduce gas into the process chamber 14 of the inner tube 12 through the furnace mouth 15. After the gas is flowed out from the process chamber 14 of the inner tube 12, it is exhausted through the exhaust pipe 17 via the exhaust line 18.

Disposed on a lower portion of the manifold 16 is a seal cap 20 that is used for closing the open end portion of the inner tube 12. The seal cap 20 is of a disk shape and has a substantially same diameter as that of the manifold 16. Disposed outside the process tube 11 is a cap elevator (not shown) for vertically moving the seal cap 20. Disposed along a centerline of the seal cap 20 is a boat 21 standing perpendicular thereto.

As shown in FIGS. 2 to 4, the boat 21 includes an upper end plate 22, a lower end plate 23, and three supporting members 24. Each supporting member 24 is vertically arranged between the couple of end plates 22 and 23 and has a multiplicity of supporting grooves 25, which are inwardly opened toward a centerline connecting center points of the upper end plate 22 and the lower end plate 23. The supporting grooves 25 are spaced apart along the supporting member 24 at an equal interval such that a set of three supporting grooves 25, each being included in a different supporting member 24, are positioned on a same plane.

Held by each set of three supporting grooves 25 is a wafer supporting unit 50. Though a multiplicity of wafer supporting units 50 are loaded in the boat 21, they can be concentrically arranged parallel to each other because each set of three supporting grooves 25 supports an outer circumferential portion of a corresponding wafer supporting unit 50. The wafer supporting unit 50 will be later explained in more detail.

Interposed between the boat 21 and the seal cap 20 is an insulating support 26 that contains an insulator 27. The insulating support 26 serves to support the boat 21, thereby spacing a lower portion thereof apart from the furnace mouth 15 with a desired gap.

As shown in FIG. 3, an insulating cover 31 surrounds an overall outermost surface of the process tube 11. Disposed between the insulating cover 31 and the process tube 11 is a heater 32 that concentrically surrounds the outer cover 13 to apply heat to an interior of the process tube 11. The insulating cover 31 and the heater 32 are vertically supported by the frame 30. The heater 32 has a first to a fifth heating part 32a to 32e sequentially arranged in a top-down direction. The first to the fifth heating part 32a to 32e are electrically connected to a temperature controller 33 so as to be systematically and, if needed, independently operated according to a sequence control.

The first to the fifth heating part 32a to 32e have a first to a fifth thermocouple 34a to 34e, respectively. Each of the thermocouples 34a to 34e transmits temperature measurements to the temperature controller 33, which performs feedback control on each of the heating parts 32a to 32e based on the temperature measurements from the thermocouples 34a to 34e. That is to say, the temperature controller 33 repeats to compute a difference between a desired temperature of each heating part and a measured temperature of its corresponding thermocouple and, if any difference is detected, control each heating part to reduce the difference.

The seal cap 20 supports a cascade thermocouple 35, which vertically passes therethrough and is positioned around an inner circumference of the inner tube 12. The cascade thermocouple 35 has a first to a fifth thermocouple element 35a to 35e that respectively correspond to the first to the fifth heating part 32a to 32e. Each of the thermocouple elements 35a to 35e transmits temperature measurements to the temperature controller 33, which performs feedback control on each of the heating parts 32a to 32e in accordance with the temperature measurements therefrom. That is to say, the temperature controller 33 repeats to compute a difference between a desired temperature of each heating part and a measured temperature of each thermocouple element and, if any difference is detected, control each heating part to reduce the difference.

Still referring to FIG. 3, a cooling air passage 41 is disposed between the insulating cover 31 and the process tube 11 such that a chilled air can be flowed in to surround the process tube 11. To supply the chilled air into the cooling air passage 41, an air supply pipe 42 is connected with a lower side portion of the insulating cover 31. Disposed at a center portion of a ceiling wall in the insulating cover 31 is an exhaust opening 43 connected with an exhaust line 44, in which a first damper 45, a hydrocooling radiator 46, a second damper 47, and a blower 48 are disposed.

Figure 5A:
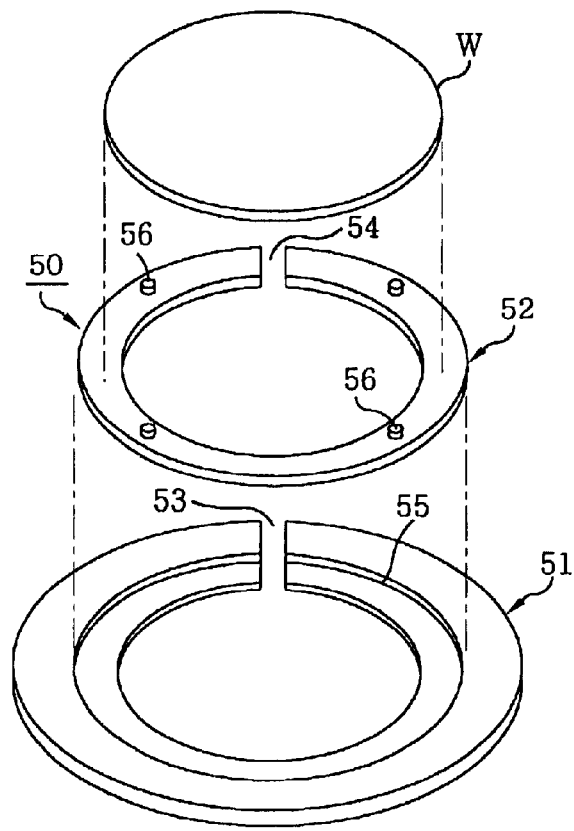
FIG. 5A shows an exploded perspective view of a wafer supporting member.

Referring now to FIG. 5, the wafer supporting unit 50 held by a corresponding set of three supporting grooves 25 is explained in more detail.

The wafer supporting unit 50 includes a first holder 51 and a second holder 52, which are respectively made of silicon carbide and quartz in the shape of a flat ring. The first holder 51 and the second holder 52 have a same inner diameter set to be equal to or smaller than an outer diameter of a wafer "W". Formed in a radial direction of the first holder 51 and the second holder 52 are a first slit 53 and a second slit 54, respectively. Preferably, an opening width of each slit is preferably set within a range of 2 to 5 mm such that the first slit 53 and the second slit 54 can sufficiently accommodate a thermal expansion of the first holder 51 and the second holder 52.

The outer diameter of the first holder 51 is set to be a little smaller than a diameter of a circle formed by connecting the three supporting grooves 25 of the boat 21. Concaved on the first holder 51 is a positioning groove 55 where the second holder 52 is mounted. When the second holder 52 is mounted on the first holder 51, the positioning groove 55 serves to concentrically match the inner circumference of the second holder 52 with that of the first holder 51. The positioning groove 55 has a little smaller depth than a thickness of the second holder 52 and an inner diameter thereof is a little larger than the outer diameter of the second holder 52. Disposed on the second holder 52 are a plurality of positioning protrusions 56 (four protrusions in this preferred embodiment). When the wafer "W" is mounted on the second holder 52, the positioning protrusions 56 contact an outer circumference of the wafer "W" such that a position thereof can be determined. If an inner circle is drawn tangential to at least three of the positioning protrusions 56, a diameter thereof is a little smaller than the outer diameter of the wafer "W".

As shown in FIGS. 1 and 2, a boat elevator 3 including a feed screw and the like is arranged on a floor inside the housing 2. The boat elevator 3 serves to vertically move the seal cap 20 by which the process tube 11 is supported.

Arranged opposite to the boat elevator 3 inside the housing 2 is a wafer transfer unit 60, which serves to selectively load wafers "W" into the boat 21 and unload them therefrom. The wafer transfer unit 60 includes a rotary linear actuator 61, which rotates a first linear actuator 62 on a horizontal plane. The first linear actuator 62 serves to horizontally move a second linear actuator 63 disposed thereon. Disposed on the second linear actuator 63 is a moving stage 64 moved horizontally thereby. Horizontally attached to the moving stage 64 are a plurality of tweezers 65 (five tweezers in the preferred embodiment) vertically spaced with an equal gap. The wafer transfer unit 60 is vertically moved by an elevator 66 including a feed screw and the like.

In addition, a clean air unit 4 is arranged on a left sidewall of the housing 2 to spray the boat 21 with a clean air. Disposed at a left side of a center of the housing 2 is a wafer stocker 5 having the same configuration as the boat 21 and serving to store a plurality of dummy wafers.

Still referring to FIGS. 1 and 2, a wafer load/unload opening 7 is formed through a near center portion of a front wall of the housing 2 such that the wafers "W" can be loaded into or unloaded from the housing 2 therethrough. Disposed at the wafer load/unload opening 7 is a pod opener 8, which includes a loading stage 8a, for mounting a pod "P" thereon, and a cap device 8b. The cap device 8b serves to remove or restore the cap of the pod "P" mounted on the loading stage 8a, thereby opening or closing a wafer-way of the pod "P".

Respectively disposed at a left and a right side of the loading stage 8a of the pod opener 8 are a first pod stage 9a and a second pod stage 9b for containing or mounting the pod "P". The pod "P" is supplied to or removed from the first pod stage 9a and the second pod stage 9b by means of a conveying system (not shown), such as a rail guided vehicle (RGV), an automated guided vehicle (AGV), and a piloted guided vehicle (PGV), each having a load-and-transport system. In addition, a pod conveying unit (not shown) is also disposed over the first pod stage 9a and the second pod stage 9b to clamp and convey the pod "P" from the pod opener 9 to the first pod stage 9a or the second pod stage 9b, and vice versa.

Disposed at one side of the wafer transfer unit 60 in the housing 2 is a wafer escapement 70 to charge or discharge the wafers "W" with respect to the wafer supporting unit 50. The wafer escapement 70 includes a multiplicity of wafer lifters 71 (five in this preferred embodiment), shown in FIG. 6. The wafer lifters 71 are layered with an equal gap interposed therebetween and has the same number as that of sets of three tweezers 65 included in the wafer transfer unit 60. Further, the gap of the layered wafer lifters 71 is substantially equal to that of the tweezers 65, i.e., a gap interposed between a couple of sets of the supporting grooves 25.

As shown in FIG. 6, each wafer lifter 71 includes a base plate 72 of a disk shape, a plurality of supporting pins 73 (four in this preferred embodiment), and another plurality of ejecting pins 74 (three in this preferred embodiment). The supporting pins 73 and the ejecting pins 74 are protruded perpendicularly to a top surface of the base plate 72.

The supporting pins 73 for supporting the supporting unit 50 are arranged at an equal interval along a circle concentric with a circumference of the base plate 72. The diameter of the circle along which the supporting pins 73 are arranged is set to be smaller than that of the wafer supporting unit 50 and larger than a width measured between two arms of the tweezers 65. All of the supporting pins 73 preferably have an equal height such that the wafer supporting unit 50 can be supported parallel to the base plate 72.

The ejecting pins 74, each of which is of a larger height than the supporting pins 73 to upwardly eject the wafer "W", are also arranged at an equal interval along another circle concentric with the circumference of the base plate 72. The diameter of the circle along which the ejecting pins 74 are arranged is set to be smaller than that of the supporting unit 50 and larger than that of the wafer "W". The height of each ejecting pin 74 is set to an equal value such that the wafer "W" can be supported parallel to the base plate 72.

Hereinafter, an operation of the small batch type heat treatment apparatus having the above-described configuration will be explained for specifying an inventive annealing process of fabricating an integrated chip (IC).

Figure 5B:
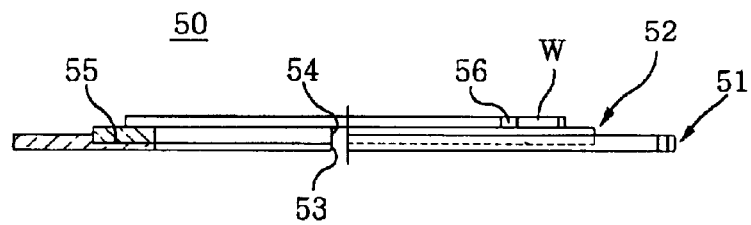
FIG. 5B describes a partial sectional view of the wafer supporting member in FIG. 5A.
Figure 5C:
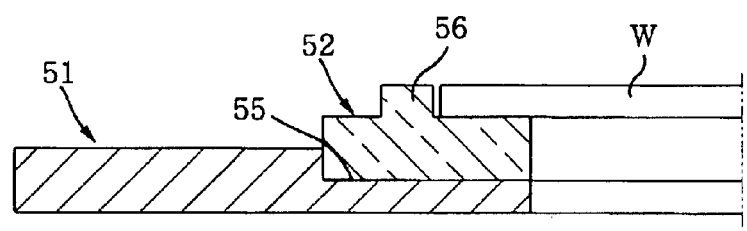
FIG. 5C provides an expended sectional view of main parts of the wafer supporting member in FIG. 5A.

While being mounted on the wafer supporting unit 50 as shown in FIGS. 5B and 5C, the wafer "W" is charged into the boat 21 by inserting the outer circumference of the first holder 51 of the wafer supporting unit 50 into the set of three supporting grooves 25 of the supporting member 24. The boat 21 is mounted on the seal cap 20 such that a series of wafers "W" therein are arranged in a vertical direction. Then, the boat elevator 3 lifts the boat 21 via the furnace mouth 15 such that the boat 21 is finally loaded into the process chamber 14 while being supported by the seal cap 20.

While the process chamber 14 is being exhausted through the exhaust pipe 17, the interior of the process chamber 14 is heated by each of the heating elements 32a to 32e of the heater 32 until a desired temperature (usually 1250 to 1350° C.) is reached for the sequence control of the temperature controller 33. Herein, a difference between the desired temperature of the sequence control and a heating temperature of the heating elements 32a to 32e can be reduced by a feedback control based on the temperature measurement from each of the thermocouples 34a to 34d. In addition, a difference between the desired temperature of the sequence control and an actual temperature of the process tube 14 can be reduced by another feedback control based on the temperature measurement from the thermocouple elements 35a to 35e of the cascade thermocouple 35.

After the above-explained heat treatment is performed for a preset time, the heating operation of the heater 32 is stopped in accordance with the sequence control of the temperature controller 33 and a chilled air 40 is flowed into the cooling air passage 41. The air supply pipe 42 supplies the chilled air 40, which is then exhausted through the exhaust line 44. While the chilled air 40 is flowing in the cooling air passage 41, it absorbs heat from the outer tube 13 of the process tube 11, thereby reducing the temperature inside the process tube 11. Such a compulsory cooling by using the chilled air 40 is more effective than a natural cooling in rapidly reducing the temperature of the process tube 11.

After a preset cooling time has passed so that the temperature of the process tube 11 is reduced, the seal cap 20 is lowered to open the furnace mouth 15. Simultaneously, a processed group of wafers "W", each supported by a corresponding wafer supporting unit 50 in the boat 21, is unloaded from the process tube 11 through the furnace mouth 15.

In the prior art, the wafer "W" is supported at a small number of points. In that case, the high temperature of above 1250° C. or thermal stress resulting from a rapid temperature increment during the heat treatment process may cause crystallographic defects (e.g., slip) in the wafer or, in certain cases, may entail the bending thereof. It is because the entire weight of the wafer is sustained at a few points, so that concentration of tensile and load stress occurs at contact portions between the wafer and the supporting grooves.

In the preferred embodiment, however, the wafer "W" is supported along its overall circumferential portion by the wafer supporting unit 50 held by a set of three supporting grooves 25. Since the wafer supporting unit 50, instead of the wafer "W" itself, is supported by the supporting grooves 25, the entire weight of the wafer is distributed along the circumference of the wafer supporting unit 50, so that concentration of tensile and load stress can be greatly reduced in the wafer "W". Accordingly, the wafer "W" is effectively protected from slip formation, damage, or bending.

In addition, because the wafer "W" is mounted on the second holder 52 which is made of quartz and mounted on the first holder 51 made of silicon carbide, a uniform temperature distribution can be obtained throughout the surface of the wafer "W" even in the case the temperature is rapidly varied in the process chamber 14. By this configuration, tensile and compressive stress determined by the friction force between the wafer and the supporting grooves is further reduced in the wafer "W" and therefore the wafer "W" can be further prevented from slip formation, damage, and bending.

Since the first holder 51 supports the circumference of the wafer "W", the temperature of the wafer "W" is uniformly increased from the circumference to a center thereof in spite of a rapid heating, so that the temperature distribution can be substantially uniform throughout the wafer "W". For the same reason, the temperature of the wafer "W" is uniformly decreased from the circumference to the center thereof in spite of a rapid cooling, so that the temperature distribution can be substantially uniform throughout the wafer "W".

In the preferred embodiment, the first slit 53 and the second slit 54 are formed to break portions of the first holder 51 and the second holder 52, respectively. When the first holder 51 and the second holder 52 are expanded or shrunk by heat, the first holder 51 and the second holder 52 serve to limit the deformation thereof such that the wafer supporting unit 50 itself is prevented from being deformed. Accordingly, the tensile and compressive stress determined by the friction force is reduced in the wafer "W" and therefore the wafer "W" can be prevented from slip formation, damage, and bending.

The opening width of each of the first slit 53 and the second slit 54 is preferably set to be relatively small, i.e., within a range of 2 to 5 mm. In spite of reducing a contact portion between the wafer "W" and each of the first holder 51 and the second holder 52, the first slit 53 and the second slit 54 rarely deteriorate the uniform temperature distribution of the wafer "W" because of the small opening width thereof. When the temperature distribution is uniform throughout the wafer "W", the annealing process can be uniformly applied to the overall surface of the wafer "W".

When the boat 21 is mounted on the wafer supporting unit 50, the first slit 53 is positioned away from the supporting groove 25 and preferably directed toward the front side, i.e., a loading and unloading direction of the wafer "W". Herein, whether the first slit 53 and the second slit 54 correspond to each other or not in their positions may be disregarded.

Since the second holder 52 of the wafer supporting unit 50 is made of quartz, it may be softened to be deformed at a high temperature of above 1200° C. Such a problem, however, can be avoided in the preferred embodiment by mounting the second holder 52 on the first holder 51 made of silicon carbide. The first holder 51 serves to support the second holder 52, thereby preventing the deformation of the second holder 52 in spite of the high temperature. Further, because quartz has a small friction resistance against the wafer, tensile and load stress determined by a friction force between the second holder 52 and therefore the wafer "W" are reduced, so that the wafer can be prevented from slip formation, damage, and bending.

If the wafer "W" made of silicon is directly mounted on the first holder 51 made of silicon carbide, the wafer may abnormally stick to the wafer supporting unit 50, so that the resultant deformation of the wafer "W" may entail the slip formation thereof. Since, however, the wafer "W" is mounted on the second holder 52 made of quartz in this preferred embodiment, the wafer rarely sticks to the holders, so that the wafer "W" can be prevented from slip formation, damage, and bending.

After the boat 21 containing the group of processed wafers "W" is unloaded from the process tube 14, the wafers "W" are discharged from the boat 21 by the wafer transfer unit 60 while being supported by the wafer supporting units 50. That is to say, each pair of tweezers 65 of the wafer transfer unit 60 is inserted into a lower portion of a corresponding wafer supporting unit 50 and subsequently elevated to separate the wafer supporting unit 50 from the boat 21. Then, each pair of tweezers 65 goes back to discharge the wafer supporting unit 50 with the wafer "W" mounted thereon from the boat 21.

Figure 6A:
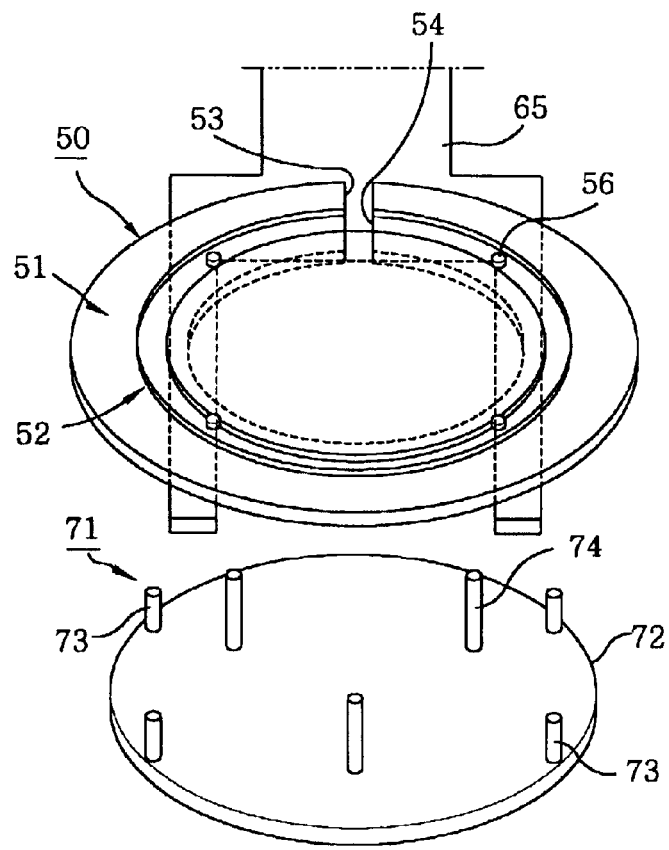
FIGS. 6A and 6B illustrate perspective views of a wafer lifter, respectively, before and after lifting a wafer together with a wafer transfer unit.
Figure 6B:
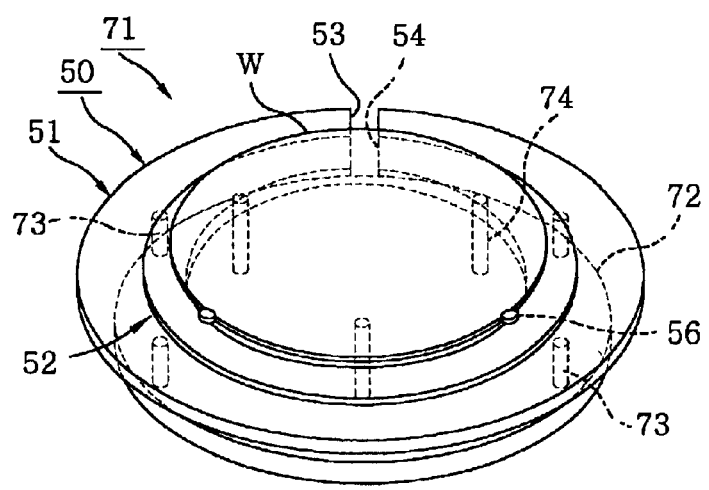

As shown in FIG. 6A, a pair of tweezers 65, supporting the wafer "W" and the wafer supporting unit 50, moves to the wafer escapement 70 and subsequently is lowered to be mounted on the wafer lifter 71 thereof. Then, as shown in FIG. 6B, the pair of tweezers 65 is withdrawn therefrom while the wafer supporting unit 50 remains on the wafer lifter 71.

When the pair of tweezers 65 is lowered on the wafer lifter 71, each arm thereof is positioned on a region between the supporting pins 73 and the ejecting pins 74. The ejecting pins 74 and the supporting pins 73 serve to raise the wafer "W" and the wafer supporting unit 50 over the tweezers 65, respectively, so that the wafer "W" and the wafer supporting unit 50 are transferred from the tweezers 65 to the wafer lifter 71. Since the ejecting pins 74 are taller than the supporting pins 73, the wafer "W" is positioned over the wafer supporting unit 50 with a predetermined gap interposed therebetween. After the wafer "W" and the wafer supporting unit 50 are mounted on the wafer lifter 71, the wafer transfer unit 60 withdraws the tweezers 65 from the wafer lifter 71.

The wafer transfer unit 60 elevates the tweezers 65 by the thickness of the wafer supporting unit 50 and subsequently advances the tweezers 65 to be inserted between the wafer "W" and the wafer supporting unit 50, both mounted on the wafer lifter 71. The pair of tweezers 65 is further elevated to lift up the wafer "W" from the ejecting pins 74 and is finally moved away from the wafer lifter 71 together with the wafer "W" by the wafer transfer unit 60.

Thereafter, the pair of tweezers 65 holding the wafer "W" thereon is transferred to pod opener 8 by the wafer transfer unit 60. The wafer "W" is subsequently inserted into the vacant pod "P" mounted on the loading stage 8a of the pod opener 8. The above-explained steps are repeated until the group of processed wafers "W" are totally inserted into the pod "P" of the pod opener 8.

Following advantages can be provided in accordance with the above-explained embodiment of the present invention.

1) The wafer is supported by the circular ring shaped wafer supporting unit while being heat-treated such that an entire weight of the wafer can be distributed along its circumferential portion. Accordingly, tensile and load stress determined by a friction force between contact portions are reduced in the wafer and therefore the wafer can be prevented from slip formation, damage, and bending.

2) The second holder made of quartz mounts the wafer thereon and is positioned on the first holder made of silicon carbide such that the temperature distribution can be uniform throughout the wafer in spite of a rapid heating or cooling. Accordingly, the annealing process is uniformly applied to the overall surface of the wafer.

3) The first slit and the second silt respectively provided for the first holder and the second holder serve to limit a deformation of the first and the second holder during a heat treatment, thereby preventing the wafer from slip formation, damage, and bending.

4) The opening width of each of the first and the second holder is set within the range of 2 to 5 mm such that the first and the second slit can rarely deteriorate the uniform temperature distribution of the wafer. Since the temperature distribution is uniform throughout the wafer, the wafer is prevented from slip formation, damage, and bending during the heat treatment.

5) Since the second holder made of quartz is mounted on the first holder made of silicon carbide, the second holder is prevented from being deformed during the heat treatment performed even at a very high temperature.

6) The wafer directly contacts not the first holder made of silicon carbide but the second holder made of quartz. Since quartz has a small friction resistance against the wafer, the tensile and load stress determined by the friction force is reduced in the wafer and therefore the wafer "W" can be prevented from slip formation, damage, and bending. In addition, because the wafer rarely sticks to the second holder, a deformation of the wafer and a slip resulting from the deformation can be further prevented.

7) Since each of the first and the second holder is of a circular ring shape, ejection pins can pass through the inner circumference of the second holder to lift up the wafer from the second holder to be subsequently withdrawn by a pair of tweezers.

While the invention has been shown and described with respect to the preferred embodiment, it will be understood to those skilled in the art that various changes and modifications may be made without departing from the spirit and scope of the invention as defined in the following claims.

For example, the first holder may be made of silicon instead of silicon carbide, or a silicon thin film may be coated on the first holder made of silicon carbide.

In the preferred embodiment, to separate the wafer from a wafer supporting unit, a pair of tweezers is used to lift and withdraw the wafer therefrom. Instead of the present method, however, the wafer may be sucked and held by applying a vacuum or static electricity to an upper portion of the wafer. In that case, the wafer supporting unit may remain still in the boat while the wafer is discharged from the wafer supporting unit.

The heat treatment of the present invention is not limited to the annealing process but may be an oxidizing process, a diffusing process, a coating process, or even a reflow process for activating carriers and leveling a surface after doping ions. Particularly, the preferred embodiment of the present invention is more effective for a heat treatment performed at a high temperature of above 1200° C.

Though the wafer is processed in the preferred embodiment, a subject substrate to be processed is not limited to the wafer but may be a photo-mask, a printed circuit board, a liquid crystal panel, a compact disc, or a magnetic disc.

The present invention is not limited to the vertical hot-wall type batch heat treatment apparatus but may be applied for a general heat treatment apparatus such as a hot-wall type individual heat treatment apparatus or a vertical hot-wall type decompression CVD apparatus.

What is claimed is:

1. A vertical heat treatment apparatus of hot-wall type comprising:
   a process tube which contains therein a plurality of silicon wafers, the process tube being of a cylindrical shape;
   a boat including a plurality of supporting members each having a plurality of supporting groves, being contained into said process tube;
   a heater which heats said wafers to a temperature above 1200° C. surrounding said process tube; and
   a plurality of supporting holders each including a first element made of silicon carbide or silicon and a second element made of quartz, said second element being mounted on said first element, wherein,
      each of said wafers is supported on said second element of each of said supporting holders, and
      each of said supporting holders is supported by said supporting grooves.

2. The apparatus of claim 1, wherein each of the first element and the second element is of a ring shape.

3. The apparatus of claim 2, wherein each of the first and the second element has a slit arranged in a radial direction thereof.

4. The apparatus of claim 3, wherein the slit has an opening width of 2 to 5 mm.

5. The apparatus of claim 1, wherein each of the first element and the second element is of a ring shape having an opening positioned at a center portion thereof.

6. A vertical heat treatment apparatus of hot-wall type comprising:
   a process tube which contains therein a plurality of silicon wafers, the process tube being of a cylindrical shape;
   a boat including a plurality of supporting members each having a plurality of supporting groves, being contained into said process tube;
   a heater which heats said wafers to a temperature above 1200° C., surrounding said process tube;
   a plurality of supporting holders each including a first element made of silicon carbide or silicon and a second element made of quartz, wherein,
      said second element is located between said first element and each of said wafers to be supported by said supporting members,
      each of said wafers is supported on said second element of each of said supporting holders, and
      each of said supporting holders is supported by said supporting grooves.

* * * * *